(12) United States Patent
Kikuchi et al.

(10) Patent No.: US 6,215,185 B1
(45) Date of Patent: Apr. 10, 2001

(54) POWER SEMICONDUCTOR MODULE

(75) Inventors: Takumi Kikuchi; Hirofumi Fujioka; Toshiyuki Kikunaga; Hirotaka Muto; Shinichi Kinouchi; Osamu Usui; Takeshi Ohi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/456,403

(22) Filed: Dec. 8, 1999

(30) Foreign Application Priority Data

Dec. 11, 1998 (JP) .................................................. 10-352217

(51) Int. Cl.[7] ..................................................... H01L 23/48
(52) U.S. Cl. .......................... 257/747; 257/718; 257/720; 257/734
(58) Field of Search .................................... 257/718, 720, 257/734, 747

(56) References Cited

U.S. PATENT DOCUMENTS

| | | | |
|---|---|---|---|
| 5,506,447 | * 4/1996 | Murakam | 257/690 |
| 5,510,650 | * 4/1996 | Erskine, Jr. | 257/707 |
| 5,696,032 | * 12/1997 | Phelps, Jr. et al. | 437/209 |
| 5,793,099 | * 8/1998 | Murakami et al. | 257/776 |
| 5,956,231 | * 9/1999 | Yamada et al. | 257/678 |

FOREIGN PATENT DOCUMENTS

| | | |
|---|---|---|
| 5-20921 | * 1/1993 | (JP) . |
| 9-642580 | 3/1997 | (JP) . |

* cited by examiner

*Primary Examiner*—David Hardy
*Assistant Examiner*—Lourdes Cruz
(74) *Attorney, Agent, or Firm*—Oblon, Spivak, McClelland, Maier & Neustadt, P.C.

(57) ABSTRACT

An object is to obtain long-term reliability of an electric connection in a power semiconductor module. In a power semiconductor module, the main circuit interconnection directly connected to a power semiconductor chip (3) is formed of a busbar (6) and the power semiconductor chip (3) and the busbar electrode (6a) of the busbar (6) are electrically connected through a conductive resin (12). A member (13) having lower thermal expansion than the busbar electrode (6a) is joined to the busbar electrode (6a) in the part adjacent to said power semiconductor chip (3).

12 Claims, 6 Drawing Sheets

POWER SEMICONDUCTOR MODULE

BACKGROUND OF THE INVENTION

1. Field of the Invention

The present invention relates to power semiconductor modules used in power conversion devices for controlling driving current for electric equipment such as motors, and more particularly to the structure of an electric connection between the power semiconductor chip and the main circuit interconnection in the power semiconductor module.

2. Description of the Background Art

FIG. 8 is a sectional view showing the structure of the main part of a general-purpose IGBT (Insulated Gate Bipolar Transistor) module as an example of a conventional power semiconductor module. In the drawing, an insulating substrate 2 is formed on a radiation base board 1 made of Al (aluminum), Cu (copper), or the like. The insulating substrate 2 is made of alumina, AlN (aluminum nitride), or the like, and thin sheet of metal, such as Cu, is bonded on both sides thereof. The insulating substrate 2 is fixed on the radiation base board 1 with solder, for example. A power semiconductor chip 3, e.g. an IGBT, is provided on the insulating substrate 2. The IGBT shown in FIG. 8 has an emitter electrode 4 on its upper surface and a collector electrode 5 on its under surface, where the collector electrode 5 is electrically connected to the thin sheet of metal (not shown) on the insulating substrate 2 with a conductive material like solder. Busbars 6 and 7 are provided for the emitter and collector, which form the main part of the main circuit interconnection of the semiconductor module. The busbars 6 and 7 are electrically connected to relay substrates 8 and also to external interconnection outside the case (not shown). Like the insulating substrate 2, the relay substrates 8 are also insulating substrates having a thin sheet of metal, e.g. Cu, bonded on both sides thereof. The relay substrates 8 are fixed on the radiation base board 1 with solder, for example. The power semiconductor chip 3 and the surface of the relay substrates 8 are electrically connected through Al (aluminum) wire bonds 9. The case 10 is designed to accommodate the power semiconductor module, inside of which is molded with silicone gel 11.

In the conventional power semiconductor module, the power semiconductor chip and the busbars are electrically connected through the Al wire bonds as explained above.

For another method of making electric connections in the power semiconductor module, a method by mechanical contact is particularly adopted for large capacity devices, in which contact surfaces of conductors to be connected are pressurized with pressure applied from outside of the module.

The power semiconductor chip and the main circuit interconnection are electrically connected by wire bonding or mechanical contact in the conventional power semiconductor modules as stated above.

When the power semiconductor chip and the main circuit interconnection are electrically connected by using Al wire bonding in a conventional power semiconductor module, the wire-bonded connection do not suffer serious problems if the module has small capacity rated below 5A, for it will not generate much heat when operating. However, a module having larger capacity generates a great deal of heat in severe temperature cycle when it operates. Then thermal stresses are generated due to the difference in thermal expansion between the power semiconductor chip 3 and the Al wire bond 9 and cause the contact surface between the power semiconductor chip 3 and the wire bond 9 to peel off, which raises the problem that it cannot ensure reliability in long time use.

More specifically, the mode of the thermal stresses mentioned above is largely different from that of thermal stresses applied to common semiconductor chips. A common semiconductor chip itself generates less heat and thermal stresses are mostly produced by external factors such as solder reflow in the assembly process and heat shock cycle in the reliability evaluating test. On the other hand, the power semiconductor modules suffer from the thermal stresses generated by the frequent and sharp temperature cycles caused by a great deal of heat generated by the power semiconductor chips when operating (when a large current flows). This problem of course becomes more serious in modules having larger capacity. Large capacity modules like those used in the fields of electric railroad and steel manufacture must ensure long life of 20 to 30 years under such severe circumstances.

Accordingly, power semiconductor modules are required to clear heat shock cycle test generally called "power cycle test," in which large current is intermittently passed to a power semiconductor chip to repeatedly vary the temperature very rapidly in an enormous number of times.

The testing is described in RELIABILITY TESTING AND ANALYSIS OF IGBT POWER MODULES, written by Peter Yacob, Marcel Held, Paolo Scacco, Wuchen Wu, IEE Colloquium on "IGBT propulsion drives" Apr. 25, 1995. In the power cycle test, conventional power semiconductor modules are mostly broken in the mode of junction peeling at wire bond connection in 80,000 to 200,000 times of cycles under the condition of $\Delta Tj=70°$ C. Where $\Delta Tj$ indicates temperature variation at the chip in one cycle.

Aside from the above-described problem of thermal stresses, the structure in which the chip and an electrode of the main circuit interconnection are joined by wire bonding in the power semiconductor module suffers the problems that the wire has small section and that only a limited number of wires can be bonded. Then the electrode (emitter electrode) formed on the surface of the chip cannot be effectively used and then the current shunt characteristic may be deteriorated. In a large-capacity module, the density of current flowing through the wire may become very high and then the over current will cause disconnection.

Further, for the process of manufacturing the power semiconductor modules, there is a trend toward application of larger pressurizing force to the wire-bonded junction surfaces to increase the junction strength of wires. Particularly, when the gate-emitter insulating film is formed under the emitter electrode surface as in the case of MOS semiconductor chip, this pressurizing force produces problems such as inferior insulation between the gate and emitter, breakage of the chip, etc., which leads to the problem of reducing the yield.

The conventional method of making electric connection through mechanical contact which has been adopted for large-capacity power semiconductor modules raises maintenance problems because variations in the pressurizing force largely influence the electric characteristics of the modules. Furthermore, when a mechanical-contact type power semiconductor module is used in a power conversion device such as an inverter, the device must be constructed as a large-scale device of stacked type, for example.

As explained so far, it is necessary for the power semiconductor modules to ensure electric connections which can allow stable passage of large current for long time at connections between materials having largely different linear expansion coefficients, such as between the power semiconductor chip and metal like copper or aluminum, under the sharp and frequent variations in temperature repeated by the heat generated by the power semiconductor chip itself. Particularly, with the recent development of power semiconductor modules toward larger capacity, more compact structure, higher switching speed, etc., the heat generation density of the power semiconductor chips is becoming very high, and ensuring the long-term reliability of the electric connections is the most important problem for the power semiconductor modules.

SUMMARY OF THE INVENTION

According to a first aspect of the present invention, a power semiconductor module comprises: a power semiconductor chip; a busbar electrically connected to the power semiconductor chip through a conductive resin, for functioning as a main circuit interconnection; a low thermal expansion member joined to the busbar and having a lower thermal expansion coefficient than the busbar; and a case for accommodating the power semiconductor chip, the busbar, and the low thermal expansion member.

Preferably, according to a second aspect, in the power semiconductor module the busbar has first and second surfaces facing each other, the conductive resin is formed in contact with the first surface of the busbar, and the low thermal expansion member is joined in contact with the second surface of the busbar.

Preferably, according to a third aspect, in the power semiconductor module, the low thermal expansion member has electric conductivity, the low thermal expansion member is formed on the conductive resin and the busbar is joined on the low thermal expansion member, and the busbar is electrically connected to the power semiconductor chip through the low thermal expansion member and the conductive resin.

According to a fourth aspect of the present invention, a power semiconductor module comprises: a power semiconductor chip; a busbar electrically connected to the power semiconductor chip through a conductive resin, for functioning as a main circuit interconnection; and a case for accommodating the power semiconductor chip and the busbar, wherein the busbar is formed in contact with the conductive resin and the contact surface is formed in a comb-like structure having at least one cut.

According to a fifth aspect of the present invention, a power semiconductor module comprises: a power semiconductor chip; an interconnection part electrically connected to the power semiconductor chip through a conductive resin, for functioning as main circuit interconnection; and a case for accommodating the power semiconductor chip and the interconnection part, wherein the interconnection part is formed in contact with the conductive resin and at least one comer of the contact surface is rounded off.

Preferably, according to a sixth aspect, in the power semiconductor module, the contact surface of the interconnection part includes a plurality of partial contact surfaces separated from each other, and at least one corner of each of the plurality of partial contact surfaces is rounded.

Preferably, according to a seventh aspect, in the power semiconductor module, the interconnection part has a through hole passing from its surface in contact with the conductive resin to opposite side to the surface.

Preferably, according to an eight aspect, the power semiconductor module further comprises a pressurizing device for pressurizing the connection part of the conductive resin with the power semiconductor chip.

As stated above, according to the power semiconductor module of the first aspect, a low thermal expansion member having a lower thermal expansion coefficient than the busbar is joined to the busbar to suppress thermal expansion of the busbar. This reduces the mismatch in thermal expansion between the power semiconductor chip and the busbar, which improves the long-term reliability of the electric connection in the power semiconductor module being the electric connection part between the busbar and the power semiconductor chip.

According to the power semiconductor module of the second aspect, the busbar has first and second surfaces facing each other, and the conductive resin is formed in contact with the first surface of the busbar and the low thermal expansion member is joined in contact with the second surface of the busbar. The power semiconductor chip and the low thermal expansion member are thus positioned to face each other through the busbar, which further improves the long-term reliability of the electric connection in the power semiconductor module.

According to the power semiconductor module of the third aspect, the low thermal expansion member is formed on the conductive resin and the busbar is joined on the low thermal expansion member. Thus connecting the low thermal expansion member directly to the power semiconductor chip with the conductive resin reduces the thermal stresses applied to the connection interface at the electric connection part in the power semiconductor module, which very effectively improves the long-term reliability of the electric connection.

According to the power semiconductor module of the fourth aspect, the busbar is formed in contact with the conductive resin and the contact surface has a comb-like structure having at least one cut. This prevents bubbles from remaining in the conductive resin and at the connection interface between the power semiconductor chip and the interconnection part, thus further improving the reliability and stability of the connection.

According to the power semiconductor module of the fifth aspect, the interconnection part is formed in contact with the conductive resin and at least one corner of the contact surface is rounded off. This suppresses local concentration of stresses to part of the contact surface, which improves the long-term reliability of the electrical connection part in the power semiconductor module being the electric connection part between the interconnection part and the power semiconductor chip.

According to the power semiconductor module of the sixth aspect, at least one corner of each of the plurality of partial contact surfaces of the interconnection part are each rounded off, which suppresses concentration of stresses to part of each of the plurality of partial contact surfaces and further improves the long-term reliability of the electric connection in the power semiconductor module.

According to the power semiconductor module of the seventh aspect, the interconnection part has a through hole passing from the surface in contact with the conductive resin to the opposite side to that surface, which provides, in addition to the effects mentioned above, the effect of preventing bubbles from remaining in the conductive resin and at the connection interface between the power semiconductor chip and the interconnection part to further improve the reliability and stability of the connection.

The power semiconductor module of the eighth aspect further comprises a pressurizing device for pressurizing the connection of the conductive resin with the power semiconductor chip, which further improves the long-term reliability of the electric connection in the power semiconductor module.

The present invention has been made to solve the various problems described above, and an object of the present invention is to obtain long-term reliability of electric connection very important for a power semiconductor module.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
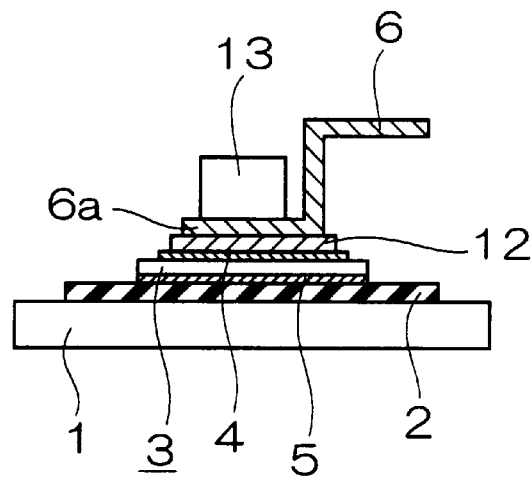
FIG. 1 is a sectional view showing the structure of the main part of a power semiconductor module according to a first preferred embodiment of the invention.

A first preferred embodiment of the present invention will now be described referring to a diagram. A power semiconductor module using an IGBT as the power semiconductor chip will be described below. FIG. 1 is a sectional view showing the structure of the main part of the power semiconductor module of the first preferred embodiment of the invention, which shows the electric connection between the semiconductor chip and the main circuit interconnection. In FIG. 1, the radiation base board 1 is made of Al, Cu, or the like. The insulating substrate 2 is made of AlN or the like, and a thin sheet of metal, such as Cu, is bonded on both sides thereof. The insulating substrate 2 is fixed on the radiation base board 1 with solder, for example. A power semiconductor chip 3, e.g. an IGBT, is provided on the insulating substrate 2. The IGBT 3 has an emitter electrode 4 on its upper surface and a collector electrode 5 on its under surface, where the collector electrode 5 is electrically connected to the thin sheet of metal on the insulating substrate 2 with a conductive material such as solder. In this case, the difference in linear expansion coefficient between the IGBT 3 and the insulating substrate 2 is small, so that it is not susceptible to cracks due to thermal stresses even if a hard material like solder is used. The busbar 6 is provided for the emitter, which forms the main part of the main circuit interconnection. The busbar 6 has a busbar electrode 6a in contact with the emitter electrode 4 of the IGBT 3. The emitter electrode 4 of the IGBT 3 and the busbar electrode 6a are connected through a conductive resin 12. A low thermal expansion member 13 is joined to the emitter busbar electrode 6a in the part adjacent to the power semiconductor chip 3.

Now the reason why the conductive resin is used to make electric connection between the power semiconductor chip and the main circuit interconnection will be described. While the power semiconductor chip has a linear expansion coefficient of 3 to 4 ppm/° C., Al wire has a linear expansion coefficient of 24 ppm/° C., for example. When the semiconductor chip, e.g. the IGBT, and the Al wire bond are electrically connected as in the conventional power semiconductor module, the considerably large difference in thermal expansion sharply and frequently generates thermal stresses because of the sharp temperature cycle caused in operation. Then the electrically connected portion may peel off, which reduces the long-term reliability of the connection. The conductive resin is used as material for buffering thermal stresses because it has lower elastic modulus than other conductive materials used to make junction, like solder. However, the volume resistivity of the conductive resin is much larger than those of metals, and therefore it has generally been regarded as being incapable of use in applications handling large current. For example, the use of the conductive resin in power distribution system was not practical, for the conductive resin causes fatal Joule dissipation.

However, in a power conversion device using semiconductor, the on-state voltage of the power semiconductor chip is as large as several volts, and it generates a very great deal of heat. Accordingly, electric connections in the power semiconductor module do not necessarily require such low resistance and low loss as may be required in other fields of heavy electric industries. No problem is encountered if they are sufficiently negligible as compared with the on-state voltage and generation loss (Joule dissipation) of the power semiconductor chip.

As discussed above, the electric connection in the power semiconductor module requires the two most important conditions shown below:

(1) It should be capable of passing large current such as motor driving current, and generation voltage and generation loss at the electric connection should be sufficiently smaller as compared with the generation voltage and generation loss in the power semiconductor chip.

(2) It should satisfy the condition (1) for long time under the sharp and frequent thermal stresses caused by the heat generated by the power semiconductor chip.

In some cases, current of tens of $A/cm^2$ or higher must be normally passed in the power semiconductor modules, and conductive resins had not been applied to units that pass such large current. Accordingly, the inventors carried out heat shock cycle tests, such as large-current passage test, power cycle test, etc., to examine the possibility of application of conductive resin to electric connections in power semiconductor modules and found that the conductive resin can be satisfactorily applied to electric connections in the power semiconductor modules. The present invention has been made on the basis of the knowledge and information obtained from the large number of experimental results.

The first preferred embodiment of the invention is characterized in that the member 13 which thermally expands less than the busbar electrode material is joined to the busbar electrode 6a connected to the power semiconductor chip 3. When the busbar electrode 6a is made of copper, for example, materials having smaller thermal expansion coefficient than that can be used as the low thermal expansion member 13, independently of whether it has electric conductivity. For example, ceramic materials such as alumina and silica and metal materials such as Mo, Cu—Mo alloy and Fe-42Ni alloy can be suitably used, but it is not limited to these materials.

When the low thermal expansion member 13 is joined to the busbar electrode 6a in the position at which the busbar electrode 6a is joined to the power semiconductor chip 3, that is, when the power semiconductor chip 3 and the low thermal expansion member 13 are located to face each other through the busbar electrode 6a, the thermal expansion of the busbar electrode 6a is suppressed by the presence of the low thermal expansion member 13. Then the thermal expansion coefficient of the busbar electrode 6a becomes smaller in the part where it is joined to the power semiconductor chip 3, which reduces the mismatch in thermal expansion between the semiconductor chip 3 and the busbar electrode 6a. This reduces the load on the conductive resin 12 used as thermal stress buffering material, thus producing the effect of preventing deterioration of the conductive resin 12, i.e. crazing or peeling off, which improves the reliability of the electric connection.

It is preferred that material having a volume resistivity of 1Ω·cm or lower is used as the conductive resin 12. When a material having a volume resistivity of about 10Ω·cm is used, for example, the resistance produced at the conductive resin may adversely influence the operation of the power semiconductor chip. Further, when much heat is generated at the conductive resin 12, other structures including the interior of the module, such as the heat sink and the insulating substrate may have to be changed.

It is preferred that the conductive resin 12 used herein has an elastic modulus of 3000 kgf/mm$^2$ or lower. For example, when a conductive resin having an elastic modulus of 5000 kgf/mm$^2$ is used, the resin having low toughness may be incapable of absorbing thermal stresses caused by the difference in thermal expansion between the power semiconductor chip 3 and the busbar electrode 6a.

While epoxy resin can be suitably used as the matrix material of the conductive resin 12 used herein, other materials, e.g. polyimide resin, phenolic resin, silicone resin, etc. can be used as long as the material satisfies the volume resistivity and elastic modulus explained in this preferred embodiment.

Also, while silver filler is normally used as the conductive filler in consideration of conductivity, stability etc., fillers of copper, gold, platinum, nickel, carbon, etc. can also be used as long as the material satisfies the volume resistivity and elastic modulus defined in this preferred embodiment.

Second Preferred Embodiment

Figure 2:
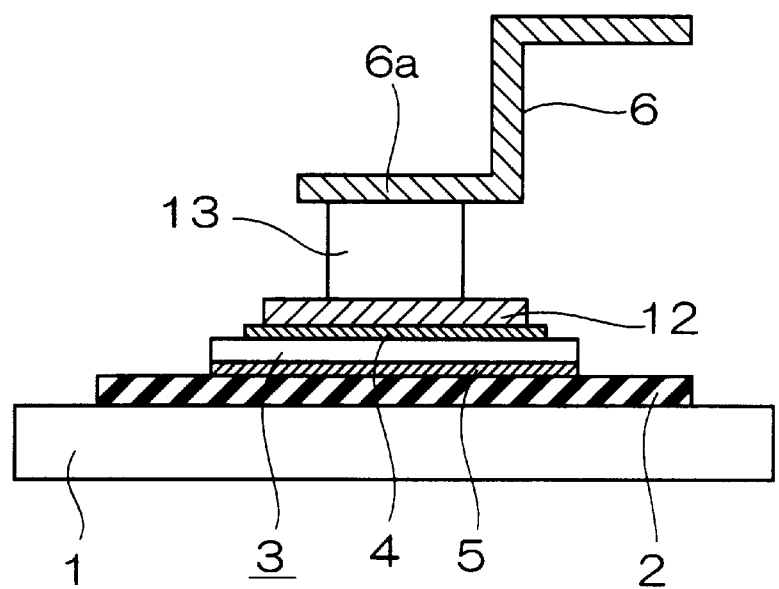
FIG. 2 is a sectional view showing the structure of the main part of a power semiconductor module according to a second preferred embodiment of the invention.

In the first preferred embodiment, the low thermal expansion member 13 is joined to the busbar electrode 6a on the side opposite to the connection with the conductive resin. However, the low thermal expansion member 13 may be joined to the busbar electrode 6a in such a manner that it is interposed between the busbar electrode 6a and the conductive resin 12. FIG. 2 is a sectional view showing the structure of the main part of a power semiconductor module thus constructed in a second preferred embodiment of the invention, which shows the electric connection between the semiconductor chip and the main circuit interconnection.

In this case, the low thermal expansion member 13 must have electric conductivity in addition to the low thermal expansivity. While low thermal expansion metal materials such as Mo, Cu—Mo alloy, Fe-42Ni alloy, etc. are desired, composite materials such as CF (carbon fiber)/Al can be used if it satisfies given conductivity and thermal expansion coefficient.

As shown in FIG. 2, the conductive low thermal expansion member 13 whose thermal expansion coefficient is close to that of the semiconductor chip 3 is joined to the busbar electrode 6a and it is then connected directly to the semiconductor chip 3 with the conductive resin 12. This structure reduces the thermal stresses applied to the connection interface and remarkably improves the long-term reliability at the electric connection.

Third Preferred Embodiment

Figure 3A:
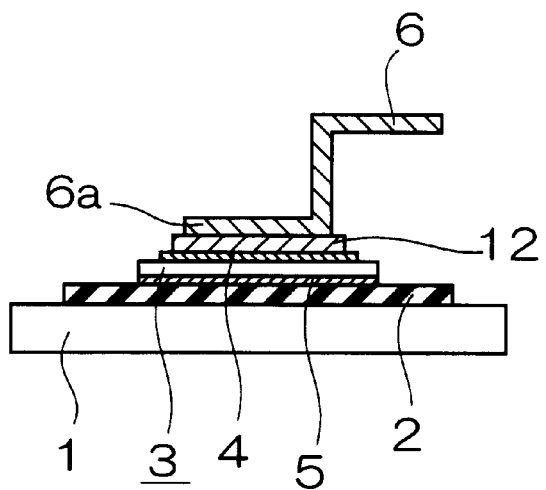
FIGS. 3A and 3B are a sectional view and a plane view showing the structure of the main part of a power semiconductor module according to a third preferred embodiment of the invention.
Figure 3B:
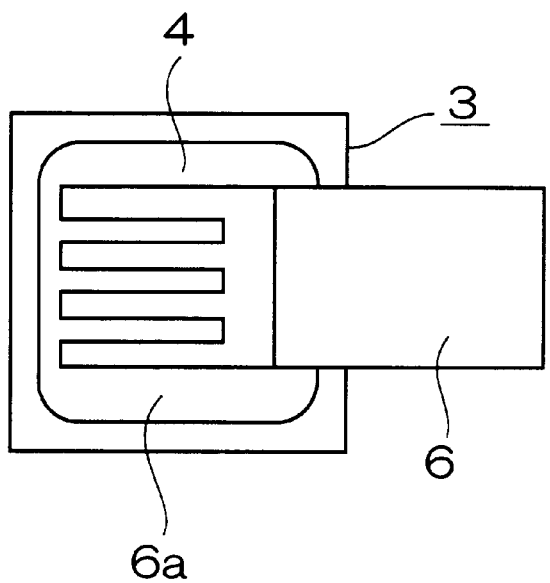

FIGS. 3A and 3B are a sectional view and a plane view showing the structure of the main part of a power semiconductor module according to a third preferred embodiment of the invention, which show the electric connection between the semiconductor chip and the main circuit interconnection.

In the power semiconductor module of the third preferred embodiment shown in FIG. 3A, the conductive resin 12 makes electric connection between the busbar electrode 6a and the power semiconductor chip 3. In this structure, as shown in FIG. 3B, the busbar electrode 6a connected to the power semiconductor chip 3 has a comb-like structure having slits like stripes (cuts) in the surface which is in contact with the conductive resin 12.

When connecting the power semiconductor chip 3 and the busbar electrode 6a, collectively connecting as large an area as possible in the effective surface of the chip is advantageous to reduce the contact resistance. However, connecting materials having different thermal expansion coefficients in a large area raises a severe problem in respect of stresses. The formation of cuts reduces the thermal stresses generated and improves the long-term reliability of the electric connection. This also provides the effect of preventing bubbles from remaining in the conductive resin and at the connection interface.

Fourth Preferred Embodiment

Figure 4A:
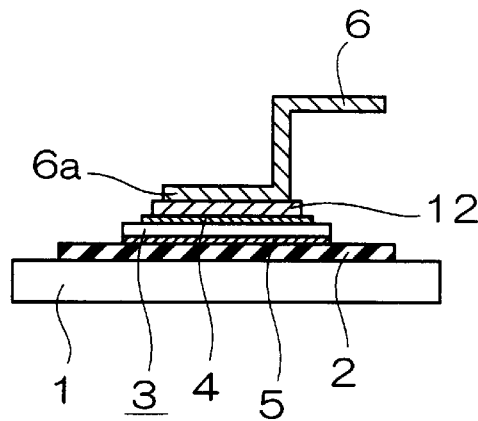
FIGS. 4A to 4C are a sectional view, an explanation diagram, and a sectional view showing structures of the main part of power semiconductor modules according to a fourth preferred embodiment of the invention.
Figure 4B:
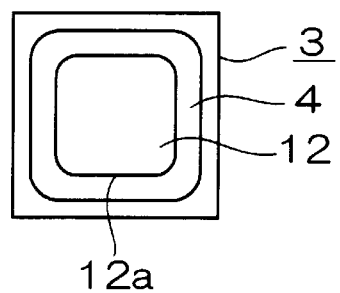

FIG. 4A is a sectional view showing the structure of the main part of a power semiconductor module according to a fourth preferred embodiment of the invention, which shows the electric connection between the semiconductor chip and the main circuit interconnection. FIG. 4B is a diagram showing the contour of the contact surface between the power semiconductor chip and the conductive resin and between the busbar electrode and the conductive resin, where the contour 12a shows the outline of this contact surface.

It is desired that the contact surface between the power semiconductor chip 3 and the conductive resin 12 and that between the busbar electrode 6a and the conductive resin 12 have the contour 12a formed in circular shape. However, passing large current requires reducing the current density and contact resistance as stated above. Therefore, as shown in FIG. 4B, the contact surface is formed in a rectangular shape close to the shape of the semiconductor chip and the busbar electrode to enlarge the contact area, and the corners of the contact surface are rounded off by R-processing.

This structure improves the long-term reliability of the electric connection. Usually, at a junction between materials having different thermal expansion coefficients, the breakage due to thermal stresses begins at the corners to which the stresses concentrate. The corners which are the most susceptible to concentration of stresses are rounded off (R-processed) as shown in FIG. 4B to remove the parts where cracks start, which retards the beginning of breakage and slows the progress of breakage leading to the final destruction, thus effectively increasing the life of the electric connection.

Figure 4C:
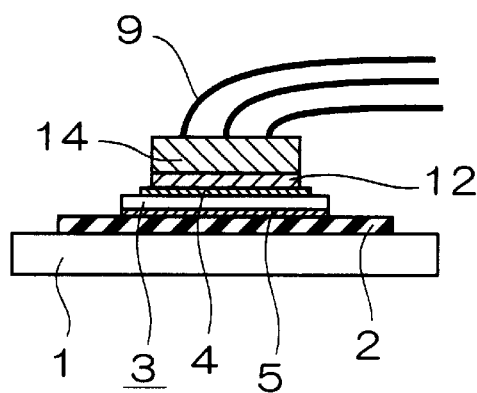

In FIG. 4A, the electrode of the main circuit interconnection which is connected to the conductive resin 12 is shown as the busbar electrode 6a explained in the first preferred embodiment. However, as shown in FIG. 4C, the structure may be constructed by connecting a conductive buffer plate 14 directly to the chip 3 with the conductive resin 12 and connecting wire bonds 9, or a thin-plate electrode, or a flat-plate electrode on the buffer plate 14. In this case, the effect of the fourth preferred embodiment can be obtained by forming the contour 12a at the contact surface between the power semiconductor chip 3 and the conductive resin 12 and between the buffer plate 14 and the conductive resin 12 as shown in FIG. 4B.

Fifth Preferred Embodiment

Figure 5A:
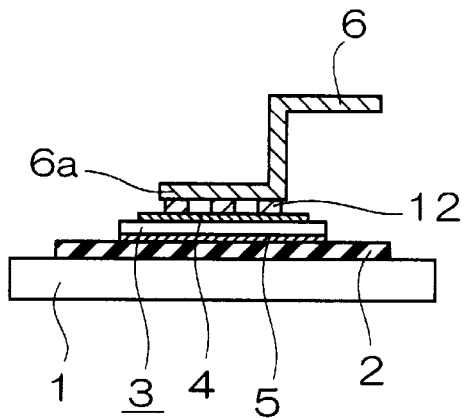
FIGS. 5A to 5C are a sectional view, an explanation diagram, and a sectional view showing structures of the main part of power semiconductor modules according to a fifth preferred embodiment of the invention.
Figure 5B:
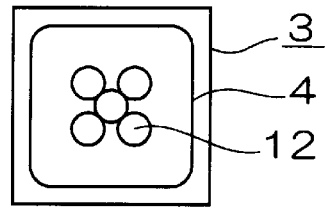

FIG. 5A is a sectional view showing the structure of the main part of a power semiconductor module according to a fifth preferred embodiment of the invention, which shows the electric connection between the semiconductor chip and the main circuit interconnection. FIG. 5B is a diagram showing the contour at the contact surface between the power semiconductor chip and the conductive resin and between the busbar electrode and the conductive resin, where the contour 12a shows the outline of this contact surface. In this preferred embodiment, the electrode is connected at a plurality of connections (five connections in FIG. 5) per chip. The contact surface at each connection has the contour 12a which is rounded off at the corners at least, e.g. the circular shape having its entire periphery rounded.

The structure shown in FIG. 5 reduces the thermal stresses generated in each connection, and the formation of the plurality of connections for each chip provides the effect of improving the long-term reliability of the electric connection.

Figure 5C:
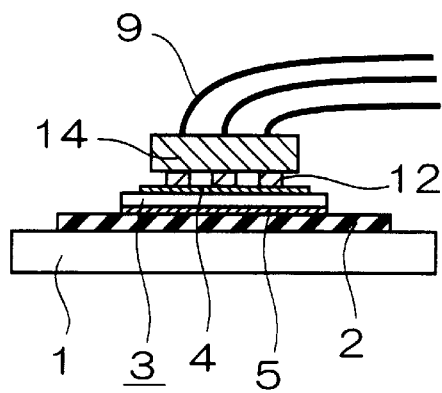

In FIG. 5A, the electrode of the main circuit interconnection which is connected to the conductive resin 12 is shown as the busbar electrode 6a explained in the first preferred embodiment. However, as shown in FIG. 5C, the structure may be constructed by connecting a conductive buffer plate 14 directly to the chip 3 with the conductive resin 12 and connecting wire bonds 9, or a thin-plate electrode, or a flat-plate electrode on the buffer plate 14. In this case, the effect of the fifth preferred embodiment can be obtained by connecting the electrode at a plurality of connections for each chip and forming the contour 12a of each connection at the contact surface in a shape rounded off at the corners at least, e.g. the circular shape, as shown in FIG. 5B.

In the fifth preferred embodiment, as shown in FIGS. 5A to 5C, the positions of connections of the electrode for one chip and the contour 12a of the contact surface are determined by the shape and position of the conductive resin 12. However, the conductive resin 12 may be formed in the form of a plane on the semiconductor chip, in which case raised and recessed parts are formed on the surface of the busbar electrode or buffer plate on the side facing to the power semiconductor chip so that the electrode can be connected at a plurality of connections for each chip. In this case, the surface of the raised parts can be formed in a circular shape so as to form the contour 12a in the shape rounded off at corners at least, at the contact surface of each connection.

Furthermore, a plurality of buffer plates may be used to connect the electrode at a plurality of connections to each chip.

Sixth Preferred Embodiment

Figure 6:
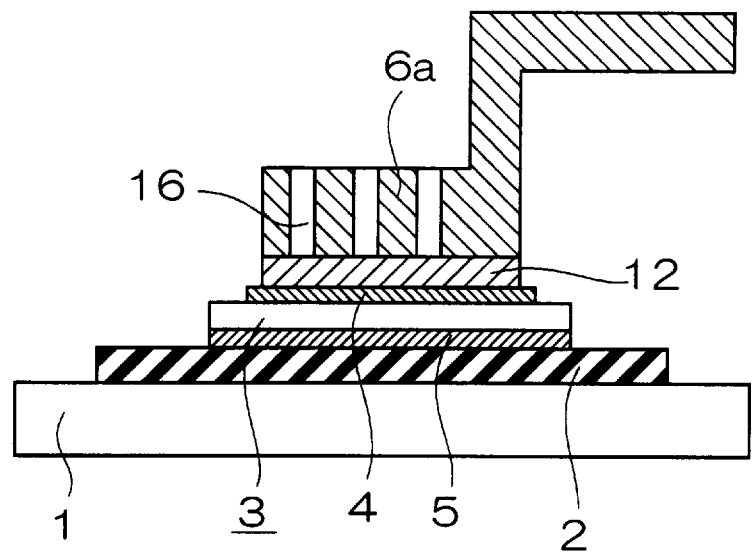
FIG. 6 is a sectional view showing the structure of the main part of a power semiconductor module according to a sixth preferred embodiment of the invention.

FIG. 6 is a sectional view showing the structure of the main part of a power semiconductor module according to a sixth preferred embodiment of the invention, which shows the electric connection between the semiconductor chip and the main circuit interconnection. In FIG. 6, the busbar electrode 6a connected to the power semiconductor chip 3 through the conductive resin 12 has through holes 16 which pass from the surface in contact with the conductive resin 12 to the side opposite to the chip 3.

This structure prevents bubbles from remaining in the conductive resin and at the connection interface. That is to say, the conductive resin is basically not susceptible to formation of bubbles because it has lower viscosity than solder and the like. However, bubbles may remain in the center part of the connection surface in the power electronics applications because it is connected in larger area. In applications in which large current is passed, the formation of bubbles is undesired because increased resistance and non-uniform resistance distribution may raise a serious problem. Even if bubbles are remaining before the conductive resin 12 is hardened, the structure shown in FIG. 6 allows the air to escape through the through holes 16 as the resin viscosity decreases in the hardening process at high temperature. Then bubbles will not remain in the conductive resin, at the interface between the power semiconductor chip and the conductive resin and at the interface between the conductive resin and the electrode in the final product, thus providing the effect of enabling the connection to be reliable and stable even when large current is passed.

Although the electrode of the main circuit interconnection connected to the conductive resin 12 in FIG. 6 is shown as the busbar electrode 6a described in the first referred embodiment, it is not limited to this.

Seventh Preferred Embodiment

Figure 7:
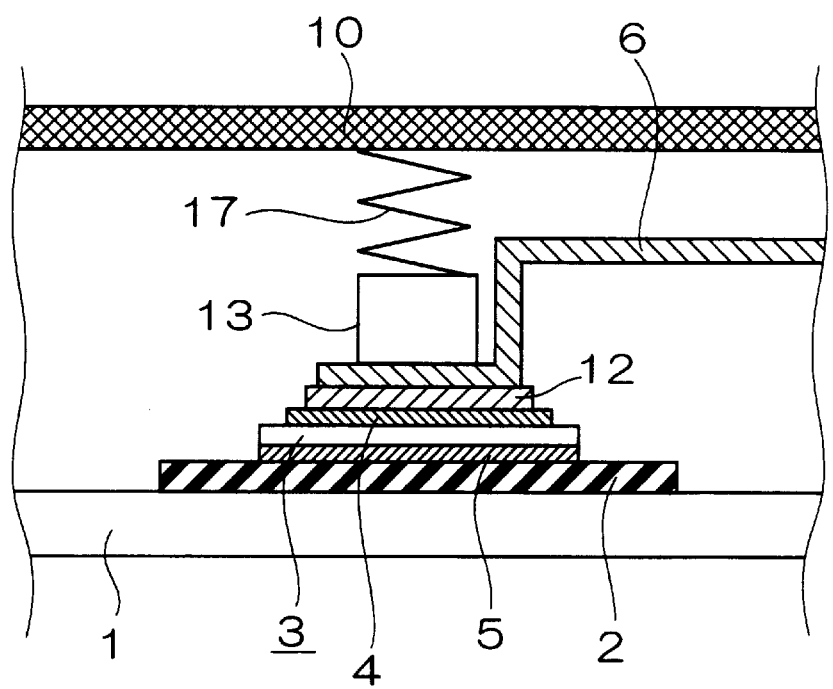
FIG. 7 is a sectional view showing the structure of the main part of a power semiconductor module according to a seventh preferred embodiment of the invention.
Figure 8:
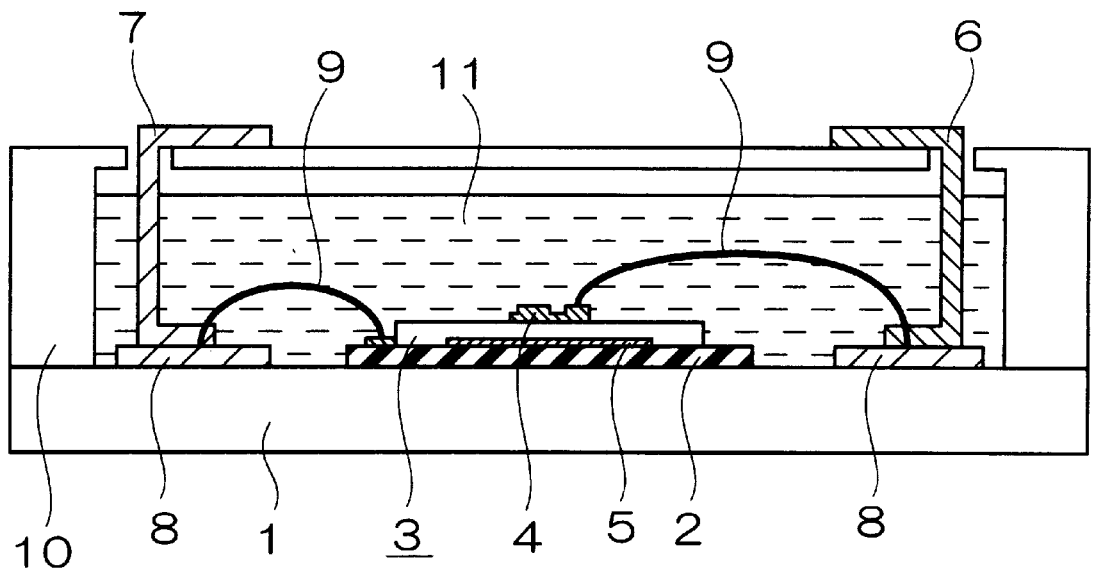
FIG. 8 is a sectional view showing the structure of the main part of a conventional power semiconductor module.

FIG. 7 is a sectional view showing the structure of the main part of a power semiconductor module according to a seventh preferred embodiment of the invention, which shows the electric connection between the semiconductor chip and the main circuit interconnection. The power semiconductor module of the seventh preferred embodiment shown in FIG. 7 differs from that shown in the first preferred embodiment in that it has a pressurizing device 17 for pressurizing the electric connection.

For the pressurizing device 17 in this preferred embodiment, a pressurizing member such as spring, rubber, or sponge can be used suitably. In FIG. 7, the pressurizing member is provided between the ceiling of the case 10 and the low thermal expansion member 13. Insulating material and non-insulating material can both be used as the pressurizing member. However, preferably, the pressurizing member and the electric connection are insulated in the latter case.

This structure can further improve the electric performance and long-term reliability of the power semiconductor module, as compared with applications not using pressurizing. That is to say, pressurizing the conductive resin improves the contact among conductive particles in the resin, which reduces the volume resistivity and reduces the contact resistance between the conductive resin and the power semiconductor chip and between the conductive resin and the interconnection electrode. This also improves the contact at the interface between the conductive resin and the power semiconductor chip and between the conductive resin and the interconnection electrode, which improves the reliability of the connection. This effect becomes more remarkable as the elastic modulus of the conductive resin becomes smaller.

The pressurizing device 17 of the seventh preferred embodiment can also be applied to the power semiconductor modules of the second to sixth preferred embodiments.

As the power semiconductor chip explained in the preferred embodiments above, so-called power semiconductors, e.g. bipolar transistor, MOS-FET, IGBT, GTO, thyristor, triac, SIT, diode, etc. can be used in place of the IGBT. A single device can be used, or some devices can be used in combination.

Although the preferred embodiments have mainly described the electric connection between the emitter electrode of the power semiconductor chip, e.g. IGBT, and the main circuit interconnection, the invention is not limited to this. The invention can be applied also to the connection between the collector electrode and the interconnection electrode, the connection between the chip and the collector electrode, the connection between the main circuit interconnection and external interconnection, the connection between the interconnection on the insulating substrate and the electrode, and the gate interconnection, for example.

While the invention has been described in detail, the foregoing description is in all aspects illustrative and not restrictive. It is understood that numerous other modifications and variations can be devised without departing from the scope of the invention.

What is claimed is:

1. A power semiconductor module comprising:
   a power semiconductor chip;
   a busbar electrically connected to said power semiconductor chip through a conductive resin, for functioning as a main circuit interconnection;
   a low thermal expansion member joined to said busbar and having a lower thermal expansion coefficient than said busbar; and
   a case for accommodating said power semiconductor chip, said busbar, and said low thermal expansion member.

2. The power semiconductor module according to claim 1, wherein said busbar has a through hole passing from its surface in contact with said conductive resin to opposite side to said surface.

3. The power semiconductor module according to claim 1, further comprising a pressurizing device for pressurizing the connection part of said conductive resin with said power semiconductor chip.

4. The power semiconductor module according to claim 1, wherein
   said busbar has first and second surfaces facing each other,
   said conductive resin is formed in contact with said first surface of said busbar, and
   said low thermal expansion member is joined in contact with said second surface of said busbar.

5. The power semiconductor module according to claim 1, wherein
   said low thermal expansion member has electric conductivity,
   said low thermal expansion member is formed on said conductive resin and said busbar is joined on said low thermal expansion member, and
   said busbar is electrically connected to said power semiconductor chip through said low thermal expansion member and said conductive resin.

6. A power semiconductor module comprising:
   a power semiconductor chip;
   a busbar electrically connected to said power semiconductor chip through a conductive resin, for functioning as a main circuit interconnection; and
   a case for accommodating said power semiconductor chip and said busbar,
   wherein said busbar is formed in contact with said conductive resin and the contact surface is formed in a comb-like structure having at least one cut.

7. The power semiconductor module according to claim 6, wherein said busbar has a through hole passing from its surface in contact with said conductive resin to opposite side to said surface.

8. The power semiconductor module according to claim 6, further comprising a pressurizing device for pressurizing the connection part of said conductive resin with said power semiconductor chip.

9. A power semiconductor module comprising:
   a power semiconductor chip;
   an interconnection part electrically connected to said power semiconductor chip through a conductive resin, for functioning as a main circuit interconnection; and
   a case for accommodating said power semiconductor chip and said interconnection part,
   wherein said interconnection part is formed in contact with said conductive resin and at least one corner of the contact surface is rounded off.

10. The power semiconductor module according to claim 9, wherein said contact surface of said interconnection part includes a plurality of partial contact surfaces separated from each other, and at least one corner of each of said plurality of partial contact surfaces is rounded.

11. The power semiconductor module according to claim 9, wherein said interconnection part has a through hole passing from its surface in contact with said conductive resin to opposite side to said surface.

12. The power semiconductor module according to claim 9, further comprising a pressurizing device for pressurizing the connection part of said conductive resin with said power semiconductor chip.

* * * * *